(12) United States Patent
Chiu et al.

(10) Patent No.: US 8,653,634 B2
(45) Date of Patent: Feb. 18, 2014

(54) EMI-SHIELDED SEMICONDUCTOR DEVICES AND METHODS OF MAKING

(75) Inventors: Chi Tsung Chiu, Kaohsiung (TW); Ying-Te Ou, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 13/493,576

(22) Filed: Jun. 11, 2012

(65) Prior Publication Data
US 2013/0328176 A1    Dec. 12, 2013

(51) Int. Cl.
*H01L 23/552* (2006.01)
(52) U.S. Cl.
USPC ............... 257/659; 257/415; 257/E29.324; 438/51
(58) Field of Classification Search
USPC ............ 257/659, 415, E29.324; 438/51
See application file for complete search history.

(56) References Cited

U.S. PATENT DOCUMENTS

| | | | |
|---|---|---|---|
| 3,390,226 A | 6/1968 | Beyerlein |
| 4,569,786 A | 2/1986 | Deguchi |
| 4,717,948 A | 1/1988 | Sakai et al. |
| 4,814,205 A | 3/1989 | Arcilesi et al. |
| 4,821,007 A | 4/1989 | Fields et al. |
| 5,140,745 A | 8/1992 | McKenzie, Jr. |
| 5,166,772 A | 11/1992 | Soldner et al. |
| 5,172,077 A | 12/1992 | Funada |
| 5,353,498 A | 10/1994 | Fillion et al. |
| 5,355,016 A | 10/1994 | Swirbel et al. |
| 5,557,142 A | 9/1996 | Gilmore et al. |
| 5,600,181 A | 2/1997 | Scott et al. |
| 5,639,989 A | 6/1997 | Higgins, III |
| 5,677,511 A | 10/1997 | Taylor et al. |
| 5,694,300 A | 12/1997 | Mattei et al. |
| 5,703,761 A | 12/1997 | Heiss |
| 5,726,612 A | 3/1998 | Mandai et al. |
| 5,729,437 A | 3/1998 | Hashimoto |
| 5,776,798 A | 7/1998 | Quan et al. |
| 5,847,930 A | 12/1998 | Kazle |
| 5,864,088 A | 1/1999 | Sato et al. |
| 5,886,876 A | 3/1999 | Yamaguchi |
| 5,895,229 A | 4/1999 | Carney et al. |
| 5,898,344 A | 4/1999 | Hayashi |
| 5,966,052 A | 10/1999 | Sakai |
| 5,977,626 A | 11/1999 | Wang et al. |
| 5,998,867 A | 12/1999 | Jensen et al. |
| 6,079,099 A | 6/2000 | Uchida et al. |
| 6,093,972 A | 7/2000 | Carney et al. |
| 6,150,193 A | 11/2000 | Glenn |
| 6,194,250 B1 | 2/2001 | Melton et al. |
| 6,225,694 B1 | 5/2001 | Terui |

(Continued)

FOREIGN PATENT DOCUMENTS

| | | |
|---|---|---|
| CN | 1442033 | 9/2003 |
| CN | 1774804 | 5/2006 |

(Continued)

*Primary Examiner* — Tu-Tu Ho
(74) *Attorney, Agent, or Firm* — Klein, O'Neill & Singh, LLP (57) ABSTRACT

A wafer level package including a shield connected to a plurality of conductive elements disposed on a silicon wafer. The conductive elements are arranged to individually enclose micro-structure elements located on the silicon wafer within cavities formed by the conductive elements for better shielding performance. The shield and the conductive elements function as the EMI shield.

16 Claims, 5 Drawing Sheets

(56) References Cited

U.S. PATENT DOCUMENTS

| | | | |
|---|---|---|---|
| 6,255,143 B1 | 7/2001 | Briar | |
| 6,261,680 B1 | 7/2001 | Denman | |
| 6,369,335 B1 | 4/2002 | Wajima | |
| 6,376,769 B1 | 4/2002 | Chung | |
| 6,448,632 B1 | 9/2002 | Takiar et al. | |
| 6,455,864 B1 | 9/2002 | Featherby et al. | |
| 6,472,598 B1 | 10/2002 | Glenn | |
| 6,472,743 B2 | 10/2002 | Huang et al. | |
| 6,479,903 B2 | 11/2002 | Briar | |
| 6,492,194 B1 | 12/2002 | Bureau et al. | |
| 6,521,978 B2 | 2/2003 | Fenk et al. | |
| 6,566,596 B1 | 5/2003 | Askew | |
| 6,586,822 B1 | 7/2003 | Vu et al. | |
| 6,602,737 B2 | 8/2003 | Wu | |
| 6,614,102 B1 | 9/2003 | Hoffman et al. | |
| 6,635,953 B2 | 10/2003 | Wu | |
| 6,686,649 B1 | 2/2004 | Mathews et al. | |
| 6,695,985 B2 | 2/2004 | Igarashi et al. | |
| 6,740,546 B2 | 5/2004 | Corisis et al. | |
| 6,740,959 B2 | 5/2004 | Alcoe et al. | |
| 6,757,181 B1 | 6/2004 | Villanueva | |
| 6,781,231 B2 | 8/2004 | Minervini | |
| 6,800,804 B2 | 10/2004 | Igarashi et al. | |
| 6,838,776 B2 | 1/2005 | Leal et al. | |
| 6,856,007 B2 | 2/2005 | Warner | |
| 6,865,084 B2 | 3/2005 | Lin et al. | |
| 6,881,896 B2 | 4/2005 | Ebihara | |
| 6,900,383 B2 | 5/2005 | Babb et al. | |
| 6,928,719 B2 | 8/2005 | Kim et al. | |
| 6,929,974 B2 | 8/2005 | Ding et al. | |
| 6,962,869 B1 | 11/2005 | Bao et al. | |
| 6,967,403 B2 | 11/2005 | Chuang et al. | |
| 6,975,516 B2 | 12/2005 | Asahi et al. | |
| 6,992,400 B2 | 1/2006 | Tikka et al. | |
| 6,998,532 B2 | 2/2006 | Kawamoto et al. | |
| 7,030,469 B2 | 4/2006 | Mahadevan et al. | |
| 7,045,385 B2 | 5/2006 | Kim et al. | |
| 7,045,868 B2 | 5/2006 | Ding et al. | |
| 7,049,682 B1 | 5/2006 | Mathews et al. | |
| 7,081,661 B2 | 7/2006 | Takehara et al. | |
| 7,098,117 B2 | 8/2006 | Najafi et al. | |
| 7,125,744 B2 | 10/2006 | Takehara et al. | |
| 7,161,252 B2 | 1/2007 | Tsuneoka et al. | |
| 7,180,012 B2 | 2/2007 | Tsuneoka et al. | |
| 7,183,498 B2 | 2/2007 | Ogura et al. | |
| 7,186,928 B2 | 3/2007 | Kikuchi et al. | |
| 7,187,060 B2 | 3/2007 | Usui | |
| 7,204,737 B2 | 4/2007 | Ding et al. | |
| 7,274,101 B2 | 9/2007 | Tomita et al. | |
| 7,294,587 B2 | 11/2007 | Asahi et al. | |
| 7,327,015 B2 | 2/2008 | Yang et al. | |
| 7,342,303 B1 | 3/2008 | Berry et al. | |
| 7,372,151 B1 | 5/2008 | Fan et al. | |
| 7,378,294 B2 | 5/2008 | Ding et al. | |
| 7,445,968 B2 | 11/2008 | Harrison et al. | |
| 7,446,265 B2 | 11/2008 | Krohto et al. | |
| 7,451,539 B2 | 11/2008 | Morris et al. | |
| 7,476,567 B2 | 1/2009 | Sato | |
| 7,478,474 B2 | 1/2009 | Koga | |
| 7,488,903 B2 | 2/2009 | Kawagishi et al. | |
| 7,576,415 B2 | 8/2009 | Cha et al. | |
| 7,608,534 B2 | 10/2009 | Yun et al. | |
| 7,629,674 B1 | 12/2009 | Foster | |
| 7,633,170 B2 | 12/2009 | Yang et al. | |
| 7,633,765 B1 | 12/2009 | Scanlan et al. | |
| 7,643,311 B2 | 1/2010 | Coffy | |
| 7,656,047 B2 | 2/2010 | Yang et al. | |
| 7,700,411 B2 | 4/2010 | Yang et al. | |
| 7,745,910 B1 | 6/2010 | Olson et al. | |
| 7,829,981 B2 | 11/2010 | Hsu | |
| 2002/0053724 A1 | 5/2002 | Lai et al. | |
| 2002/0093108 A1 | 7/2002 | Grigorov | |
| 2004/0020673 A1 | 2/2004 | Mazurkiewicz | |
| 2004/0063242 A1 | 4/2004 | Karnezos | |
| 2004/0150097 A1 | 8/2004 | Gaynes et al. | |
| 2004/0178500 A1 | 9/2004 | Usui | |
| 2004/0231872 A1 | 11/2004 | Arnold et al. | |
| 2004/0252475 A1 | 12/2004 | Tsuneoka et al. | |
| 2005/0013082 A1 | 1/2005 | Kawamoto et al. | |
| 2005/0029673 A1 | 2/2005 | Naka et al. | |
| 2005/0039946 A1 | 2/2005 | Nakao | |
| 2005/0045358 A1 | 3/2005 | Arnold | |
| 2005/0208702 A1 | 9/2005 | Kim | |
| 2006/0145361 A1 | 7/2006 | Yang et al. | |
| 2006/0148317 A1 | 7/2006 | Akaike et al. | |
| 2006/0160261 A1 | 7/2006 | Sheats et al. | |
| 2006/0214202 A1* | 9/2006 | Zorich et al. | 257/294 |
| 2006/0266547 A1 | 11/2006 | Koga | |
| 2008/0042301 A1 | 2/2008 | Yang et al. | |
| 2008/0061407 A1 | 3/2008 | Yang et al. | |
| 2008/0128890 A1 | 6/2008 | Choi et al. | |
| 2008/0174013 A1 | 7/2008 | Yang et al. | |
| 2009/0000114 A1 | 1/2009 | Rao et al. | |
| 2009/0000815 A1 | 1/2009 | Hiner et al. | |
| 2009/0000816 A1 | 1/2009 | Hiner et al. | |
| 2009/0002969 A1 | 1/2009 | Madsen et al. | |
| 2009/0002970 A1 | 1/2009 | Leahy et al. | |
| 2009/0002971 A1 | 1/2009 | Carey et al. | |
| 2009/0002972 A1 | 1/2009 | Carey et al. | |
| 2009/0025211 A1 | 1/2009 | Hiner et al. | |
| 2009/0035895 A1 | 2/2009 | Lee et al. | |
| 2009/0075428 A1 | 3/2009 | Tang et al. | |
| 2009/0091018 A1* | 4/2009 | Maeda et al. | 257/693 |
| 2009/0102003 A1 | 4/2009 | Vogt et al. | |
| 2009/0102033 A1 | 4/2009 | Raben | |
| 2009/0194851 A1 | 8/2009 | Chiu et al. | |
| 2009/0194852 A1 | 8/2009 | Chiu et al. | |
| 2009/0230487 A1 | 9/2009 | Saitoh et al. | |
| 2009/0230523 A1 | 9/2009 | Chien et al. | |
| 2009/0230524 A1 | 9/2009 | Chien et al. | |
| 2009/0230525 A1 | 9/2009 | Chien et al. | |
| 2009/0230526 A1 | 9/2009 | Chen et al. | |
| 2009/0236700 A1 | 9/2009 | Moriya | |
| 2009/0256244 A1 | 10/2009 | Liao et al. | |
| 2009/0261470 A1 | 10/2009 | Choi et al. | |
| 2009/0294928 A1 | 12/2009 | Kim et al. | |
| 2010/0006330 A1 | 1/2010 | Fu et al. | |
| 2010/0013064 A1 | 1/2010 | Hsu | |
| 2010/0032815 A1 | 2/2010 | An et al. | |
| 2010/0109132 A1 | 5/2010 | Ko et al. | |
| 2010/0110656 A1 | 5/2010 | Ko et al. | |
| 2010/0199492 A1 | 8/2010 | Hiner et al. | |
| 2010/0207257 A1 | 8/2010 | Lee | |
| 2010/0207258 A1 | 8/2010 | Eun et al. | |
| 2010/0207259 A1 | 8/2010 | Liao et al. | |
| 2011/0006408 A1 | 1/2011 | Liao | |
| 2011/0115059 A1 | 5/2011 | Lee et al. | |
| 2011/0115060 A1 | 5/2011 | Chiu et al. | |
| 2011/0115066 A1 | 5/2011 | Kim et al. | |
| 2011/0127654 A1 | 6/2011 | Weng et al. | |
| 2011/0274299 A1* | 11/2011 | Shaw et al. | 381/174 |
| 2012/0267730 A1* | 10/2012 | Renard et al. | 257/415 |

FOREIGN PATENT DOCUMENTS

| | | |
|---|---|---|
| JP | 55044737 | 3/1980 |
| JP | 58122759 | 7/1983 |
| JP | 59051555 | 3/1984 |
| JP | 63262860 | 10/1988 |
| JP | 64037043 | 2/1989 |
| JP | 64064298 | 3/1989 |
| JP | 2078299 | 3/1990 |
| JP | 3023654 | 1/1991 |
| JP | 3171652 | 7/1991 |
| JP | 4147652 | 5/1992 |
| JP | 4206858 | 7/1992 |
| JP | 5129476 | 5/1993 |
| JP | 8288686 | 1/1996 |
| JP | 2003273571 | 9/2003 |
| WO | WO2004060034 | 7/2004 |
| WO | WO2006/076613 | 7/2006 |

* cited by examiner

EMI-SHIELDED SEMICONDUCTOR DEVICES AND METHODS OF MAKING

TECHNICAL FIELD

The present invention relates to semiconductor packages, and more particularly to wafer-level package structures and methods of making.

BACKGROUND

Electromagnetic interference (EMI) is a serious and challenging problem for most electronic devices and systems. Because EMI disturbances can interrupt, degrade, or limit the effective performance of electronic devices or entire circuits of electronic systems, it is advantageous for electronic devices and systems to have efficient EMI protection to ensure their effective and safe operation.

EMI protection is particularly important in small-sized, densely packaged, or sensitive electronic applications operating at high frequencies. Conventionally, EMI shielding solutions involve the use of metal plates, which are later attached or affixed to the semiconductor package.

SUMMARY

One of the present embodiments comprises a semiconductor package. The semiconductor package comprises a semiconductor die and a micro-structure element disposed on an upper surface of the semiconductor die. The semiconductor package further comprises a conductive element disposed on the upper surface of the semiconductor die. The conductive element circumscribes the micro-structure element and forms a cavity where the micro-structure element resides. The semiconductor package further comprises a shield disposed over the conductive element, the cavity, and the micro-structure element to provide electromagnetic interference (EMI) shielding for the micro-structure element.

Another of the present embodiments comprises a semiconductor package. The semiconductor package comprises a semiconductor die and a micro-structure element disposed on an upper surface of the semiconductor die. The semiconductor package further comprises a conductive element disposed on the upper surface of the semiconductor die and circumscribing the micro-structure element. The semiconductor package further comprises a shield disposed over the micro-structure element to provide electromagnetic interference (EMI) shielding for the micro-structure element. The shield comprises a first thickness in an area located over the micro-structure element, and a second thickness in areas not located over the micro-structure element, and the first thickness is less than the second thickness.

Another of the present embodiments comprises a method of forming a semiconductor package. The method comprises providing a semiconductor wafer having a plurality of sub-units. The method further comprises disposing at least one micro-structure element on each sub-unit. The method further comprises electrically connecting the micro-structure elements to the semiconductor wafer. The method further comprises forming a plurality of conductive elements on the semiconductor wafer with each conductive element encircling at least one of the micro-structure elements and forming cavities in which the micro-structure elements reside. The method further comprises disposing a shield over the conductive elements to enclose the micro-structure elements within the cavities.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1A:
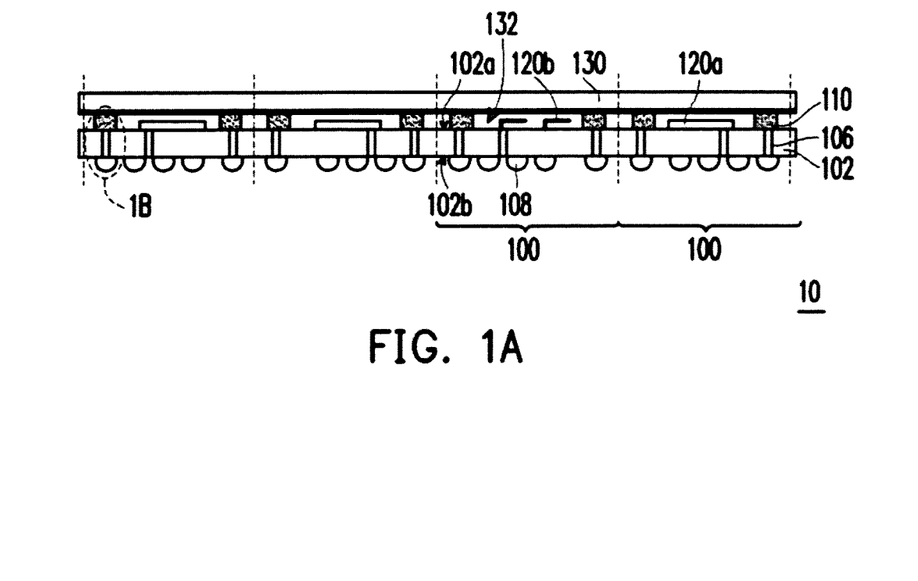
FIG. 1A is a cross-sectional side view of a matrix of semiconductor packages in pre-singulated wafer form, according to one of the present embodiments.

Referring to FIG. 1A, a matrix 10 of semiconductor packages 100 in pre-singulated wafer form according to the present embodiments is illustrated. The matrix includes a semiconductor wafer 102 having a plurality of die (indicated by the dashed lines), which may be either active die having one or more integrated circuits or inactive/dummy die, devoid of active circuitry, that serves as a carrier or package substrate, a plurality of through silicon via (TSV) structures 106, a plurality of external contacts 108, a plurality of conductive elements 110, a plurality of micro-structure elements 120a, 120b and a shield 130. The micro-structure elements 120a, 120b, which are collectively referred to herein as micro-structure elements 120, are disposed on an upper surface 102a of the semiconductor wafer 102. The external contacts 108 are disposed on a lower surface 102b of the semiconductor wafer 102. The semiconductor wafer 102 may be a silicon wafer or other semiconductor material such as GaAs, which is divided into a plurality of individual dies 100 (defined by the cutting lines that are represented by the dotted vertical lines) in a subsequent singulation process. The singulation does not cut through the conductive elements 110.

The conductive elements 110 are located on the upper surface 102a of the semiconductor wafer 102. The material of the conductive elements 110 may be a conductive adhesive or a solder material, for example. The shield 130 is located on the conductive elements 110, over the semiconductor wafer 102, and covers the micro-structure elements 120, but is not in direct contact with the micro-structure elements 120. Through the connection of the shield 130, the conductive elements 110 and the semiconductor wafer 102, the enclosed micro-structure elements 120 are sealed so as to inhibit electromagnetic interference (EMI).

The micro-structure elements 120 may be an integrated circuit or a micro-electromechanical system (MEMS) device, for example. The MEMS device may include micro-sized electromechanical components, such as motors, pumps, valves, switches, capacitors, accelerometers, sensors, pixels, microphones, speakers, gyroscopes, or actuators etc. The micro-structure elements 120a, 120b may include two different types of MEMS devices. The micro-structure elements 120 may be electrically connected to the external contacts 108 through the TSV structures 106. The external contacts 108 may be solder or gold bumps, for example.

Figure 1B:
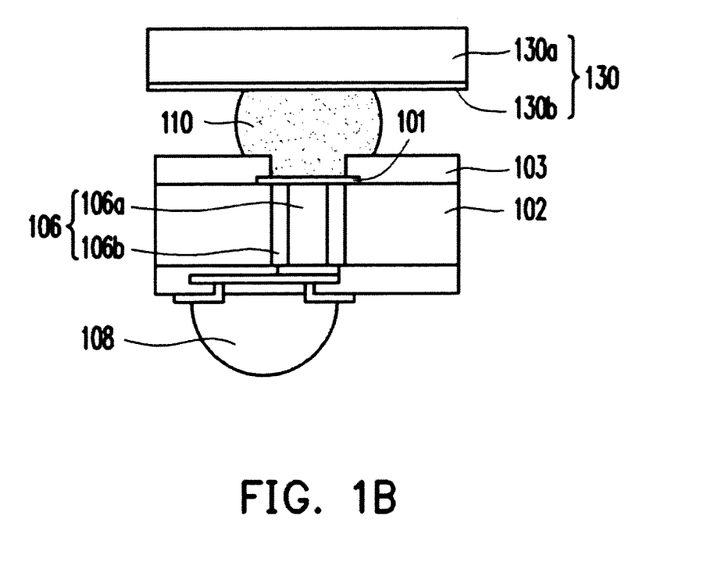
FIG. 1B is a detail view of the portion of the matrix of semiconductor packages of FIG. 1A indicated by the oval 1B in FIG. 1A.

FIG. 1B is an enlarged cross-sectional view of the portion of FIG. 1A indicated by the oval 1B. The semiconductor wafer 102 further includes a plurality of ground pads 101, of which only one is shown in FIG. 1B, and a passivation layer 103. The passivation layer 103 covers the upper surface of the semiconductor wafer 102, but exposes the ground pads 101 and the locations for mounting the micro-structure elements 120. The TSV structure 106 includes a metal plug 106a and an insulating ring 106b surrounding the central metal plug 106a and electrically isolating the metal plug 106a.

In the illustrated embodiment, the shield 130 includes a base layer 130a and a shielding layer 130b, with the shielding layer 130b being disposed beneath the base layer 130a. The electrical contact 108 is electrically connected to the ground end (not shown in FIG. 1B) of an external circuit element, such as a printed circuit board. The shielding layer 130b is electrically connected to the ground end through the conductive elements 110, the TSV structure 106, and the external contacts 108.

The base layer 130a may be silicon, glass, or any other material, while the shielding layer 130b may be copper, chromium, gold, silver, nickel, aluminum, alloys thereof, or any other material, for example. The shielding layer 130b may have a thickness of about 1-10 microns, for example, and be formed by screen-printing, sputtering, plating, or any other method. The shielding layer 130b reduces the interference or noise for the MEMS devices, especially for devices like MEMS microphones, MEMS accelerometers, and MEMS gyroscopes. The shielding layer 130b may be further treated to have a surface finish layer (e.g. nickel/palladium/gold stacked layer) by the electroless nickel electroless palladium immersion gold (ENEPIG) technology, for example. The surface finish layer can enhance the bonding with the conductive elements 110 when the conductive elements 110 are made of a solder material.

The two-layer configuration for the shield 130 advantageously provides greater rigidity as compared to, for example, a single-layer thin copper shield. A single-layer shield might sag in the middle under its own weight, which could cause it to contact the micro-structure elements 120, which could damage the micro-structure elements 120, short circuit them, etc. However, in alternative embodiments the shield 130 may comprise a single-layer of metal.

With continued reference to FIG. 1B, the conductive elements 110 are disposed on the ground pad 101, over the passivation layer 103, and beneath the shielding layer 130b. When the conductive elements 110 are made of a solder material, they may have a height of about 15-30 microns, which is higher than a height of the micro-structure elements 120, which may be about 1-5 microns. The conductive elements 110 thus function as spacers or supporting members located between the shielding layer 130b and the semiconductor wafer 102. The shield 130 provides EMI shielding, and the shielding layer 130b is grounded through the conductive elements 110, the ground pad 101, the TSV structure 106, and the contact 108.

Figure 1C:
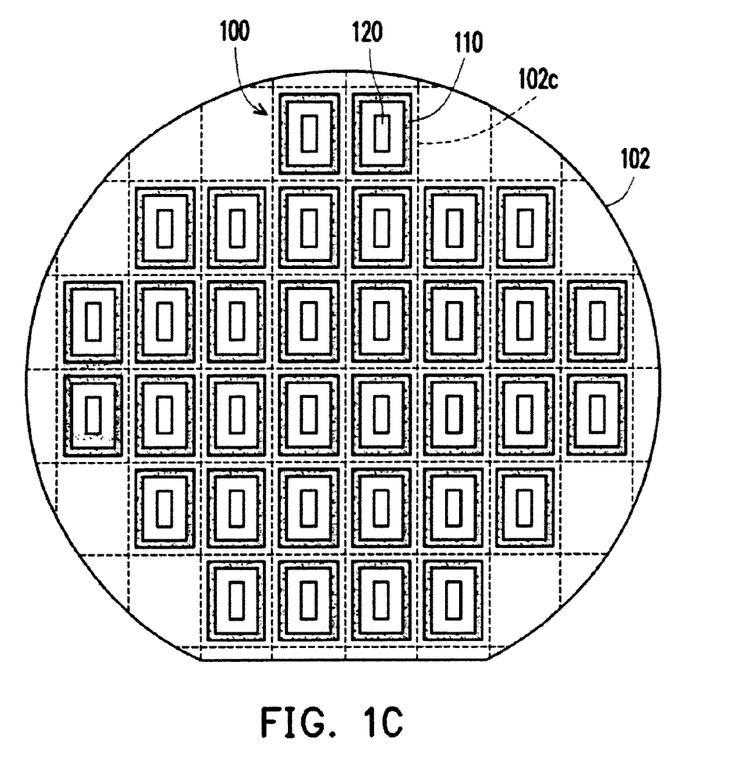
FIG. 1C is a top plan view of the matrix of semiconductor packages of FIG. 1A prior to attachment of the EMI shield.

FIG. 1C is a top plan view of the matrix 10 of semiconductor packages 100 of FIG. 1A prior to placement of the shield 130. Each conductive element 110 circumscribes at least one of the micro-structure elements 120, thereby forming a cavity 132 (FIG. 1A) in which the micro-structure element 120 resides with the shield 130 closing the cavity 132. Each conductive element 110 may be a continuous structure in the shape of, for example, a square, a rectangle, a circle, an oval, or any other polygon. The conductive element 110 for each semiconductor package 100 may extend to a periphery 102c of the portion of the wafer 102 of that package 100, or may be set back from the periphery 102c, as shown in the embodiment of FIG. 1C.

Figure 2A:
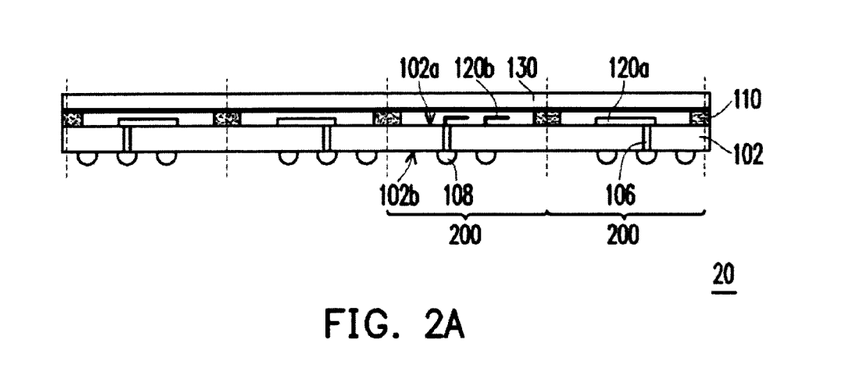
FIG. 2A is a cross-sectional side view of a matrix of semiconductor packages in pre-singulated wafer form, according to another of the present embodiments.
Figure 2B:
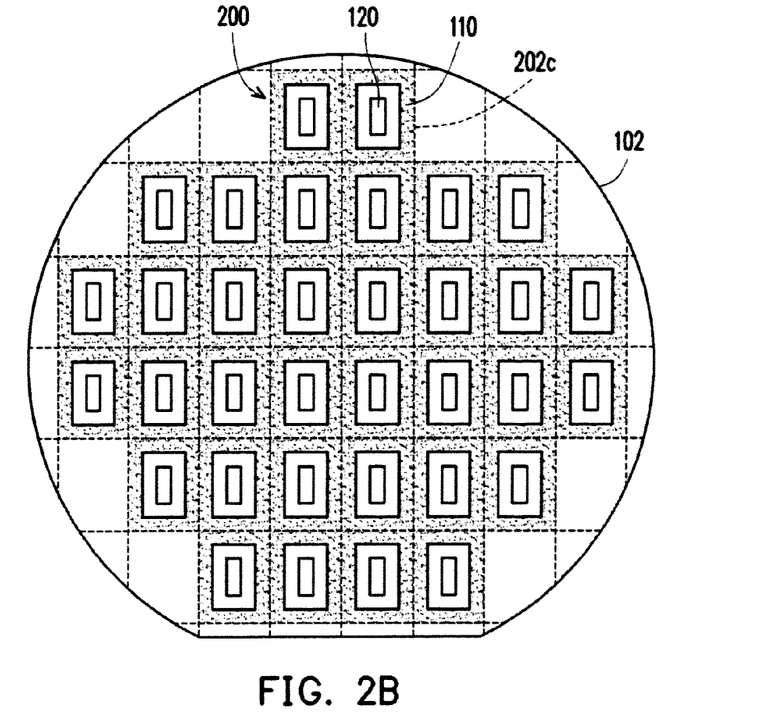
FIG. 2B is a top plan view of the matrix of semiconductor packages of FIG. 2A prior to attachment of the EMI shield.

Referring to FIG. 2A, a side cross-sectional view of a matrix 20 of semiconductor packages 200 according to another of the present embodiments is illustrated. The semiconductor packages 200 are similar to the packages 100 described above with respect to FIGS. 1A-1C, however, the packages 200 are singulates through the conductive elements 110. Thus, referring to FIG. 2B, each conductive element 110 circumscribes at least one of the micro-structure elements 120 with the conductive element 110 extending to a periphery 202c of the portion of the wafer 102 of that package 200.

Figure 3A:
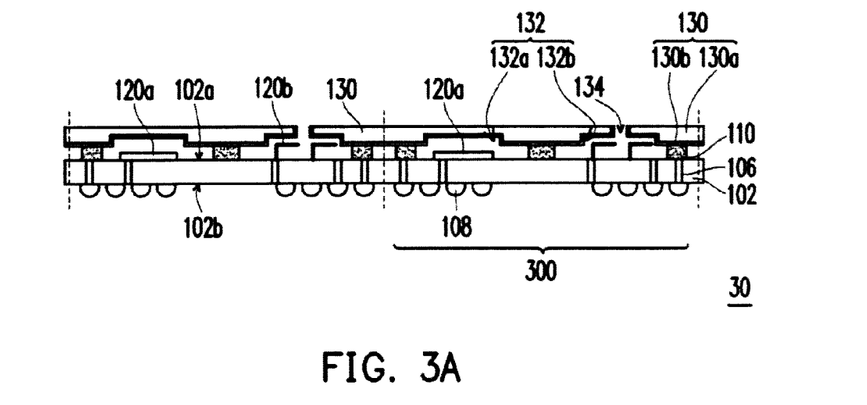
FIG. 3A is a cross-sectional side view of a matrix of semiconductor packages in pre-singulated wafer form, according to one of the present embodiments.

Referring to FIG. 3A, a side cross-sectional view of a matrix 30 of semiconductor packages 300 according to another of the present embodiments is illustrated. The semiconductor packages 300 are similar to the packages 100 described above with respect to FIGS. 1A-1C. However, each semiconductor package 300 includes first and second cavities 132a, 132b corresponding to first and second micro-structure elements 120a, 120b. For each package 300, two conductive elements 110 each respectively enclose one of the micro-structure elements 120a, 120b.

Each of the cavities 132a, 132b includes a greater height as compared to the embodiments of FIGS. 1 and 2, due to a decreased thickness in the shield 130 in the areas over the micro-structure elements 120a, 120b. Further, the shield includes an opening 134 that exposes the cavity 132b to the ambient. The first micro-structure elements 120a may be, for example, a MEMS switch, while the second micro-structure elements 120b may be, for example, a MEMS speaker with a vibration diaphragm to produce sound. The opening 134 facilitates sound from the second micro-structure elements 120b being transmitted out of the cavities 132b. The sizes of the first and second cavities 132a, 132b may be different and may adjusted to accommodate different types or requirements of the MEMS devices.

Figure 3B:
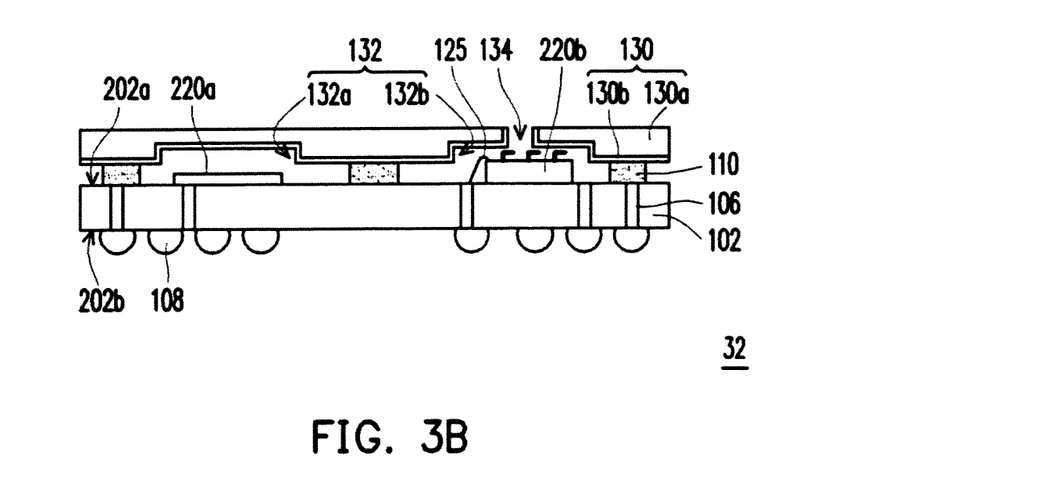
FIG. 3B is a cross-sectional side view of one of the semiconductor packages of FIG. 3A.

Referring to FIG. 3B, a cross-sectional view of a semiconductor package 32 according to another of the present embodiments is illustrated. The semiconductor package 32 includes a semiconductor device 220b and an electrical interconnection 125, such as a wire bond. In this embodiment, the semiconductor wafer 102 is an application-specific integrated circuit (ASIC) chip that has been singulated and then placed on a wafer, for example. For clarity, only a portion of the semiconductor package structure over the singulated ASIC chip is shown.

For each package 32, two conductive elements 110 each respectively enclose a semiconductor device 220a, 220b. The first cavity 132a contains the first semiconductor device 220a, and the second cavity 132b contains the second semiconductor device 220b. The first semiconductor device 220a may be a MEMS device, such as a MEMS accelerometer, while the second semiconductor device 220b may be a MEMS microphone with a sensing diaphragm to sense the vibration of sound in pressure. The second cavity 132b has the opening 134 so that the second semiconductor device 220b (the diaphragm of the microphone) can sense vibrations in the ambient. The sizes of the first and second cavities 132a, 132b may be different and may be adjusted to accommodate different types or requirements of the MEMS devices.

Figure 4A:
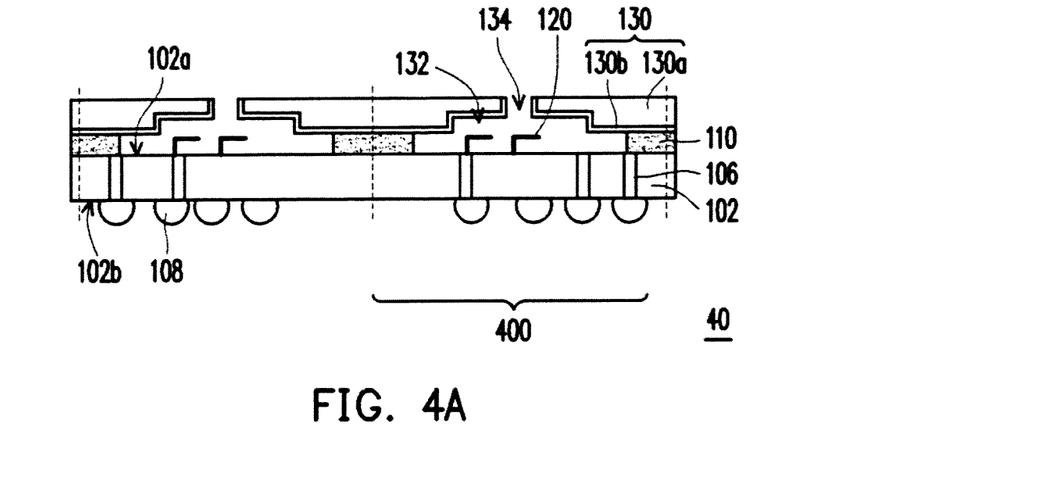
FIG. 4A is a cross-sectional side view of a matrix of semiconductor packages in pre-singulated wafer form, according to one of the present embodiments.

Referring to FIG. 4A, a matrix 40 of semiconductor packages 400 in pre-singulated wafer form according to another of the present embodiments is illustrated. The semiconductor package 40 is singulated through the conductive elements 110. Each conductive element 110 circumscribes at least one micro-structure element 120. For each package 400 (defined by the dotted singulation lines), each conductive element 110 encloses one micro-structure element 120 in a one-to-one fashion. However, in this embodiment, the conductive elements 110 in adjacent packages 400 are connected to one another, and are cut through along the dotted lines during the singulation process. The shield 130 may be provided with or without the cavities 132 and/or with or without the openings 134, depending on the types or properties of the MEMS devices to be shielded.

Figure 4B:
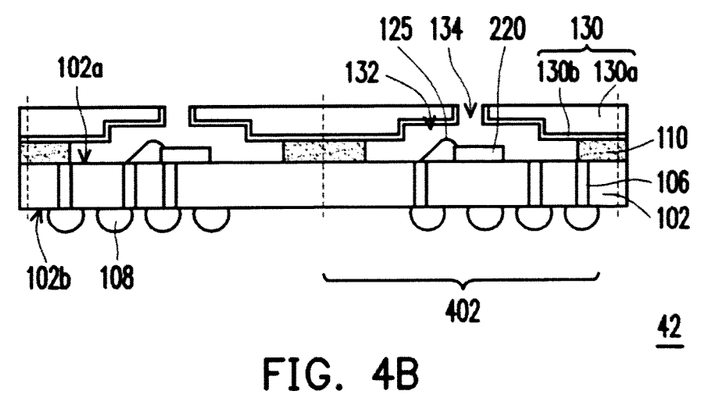
FIG. 4B is a cross-sectional side view of one of the semiconductor packages of FIG. 4A.

Referring to FIG. 4B, a matrix 42 of semiconductor packages 402 in pre-singulated wafer form according to another of the present embodiments is illustrated. The semiconductor package 42 includes a semiconductor device 220 and an electrical interconnection 125, such as a wire bond. The shield 130 includes the cavities 132 disposed over the semiconductor devices 220. The shield 130 may further include alignment marks (not shown) corresponding to alignment marks (not shown) on the semiconductor wafer 102 to facilitate accurate alignment and prevent shifting of the shield 130 relative to the semiconductor wafer 102. The shield 130 is grounded through the conductive elements 110, the TSV structures 106, the ground pads 101, and the external contacts 108 of the semiconductor wafer 102.

The shield 130 may be formed by providing a silicon or glass plate (base layer 130a) having a plurality of cavities 132 and forming a metal layer (shielding layer 130b) by sputtering or plating to conformally cover the lower surface of the silicon or glass plate 130a. The material of the shielding layer may be any of those described above with respect to FIG. 1B. The depth of the cavity 132 may be around 20-30 microns, for example, depending on the height of the semiconductor device 220. However, the thickness of the shielding layer 130b and/or the sizes and/or shapes of the cavities 132 may be altered to meet any design needs.

A singulation process is subsequently performed on the wafer 102 to form the individual packages 402. The singulation process may be a blade sawing process, for example. The singulation process cuts along the dashed cutting lines, and may cut through or beside the conductive elements 110. In the semiconductor package structures 402 of the present embodiment, the shielding layer 130b of the shield 130 and the conductive elements 110 disposed on the wafer 102 together function as an EMI shield for protecting each of the semiconductor devices 220 from EMI from any surrounding radiation sources.

Advantageously, the design of the EMI shielding for the package structures of the present embodiments may be flexibly adjusted according to product requirements, because the shapes and/or locations of the cavities may be modified accordingly. Furthermore, compared to other configurations that have a single EMI shield for a plurality of semiconductor devices arranged in arrays, the shielding layer and the conductive elements surrounding the devices as described herein provide EMI shielding for individual devices. In this way, the radio interference between adjacent devices may be reduced and the EMI shielding performance is enhanced.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
    a semiconductor die;
    a micro-structure element disposed on an upper surface of the semiconductor die;
    a conductive element disposed on the upper surface of the semiconductor die, the conductive element circumscribing the micro-structure element and forming a cavity where the micro-structure element resides; and
    a shield disposed over the conductive element, the cavity, and the micro-structure element to provide electromagnetic interference (EMI) shielding for the micro-structure element;
    wherein the semiconductor die includes at least one through hole, and the shield is electrically connected the conductive element and the at least one through hole.

2. The semiconductor package of claim 1, wherein the conductive element extends to a periphery of the semiconductor die.

3. The semiconductor package of claim 1, wherein the conductive element is set back from a periphery of the semiconductor die.

4. The semiconductor package of claim 1, wherein the shield includes a base layer and a metal shielding layer covering the base layer.

5. The semiconductor package of claim 1, wherein the shield comprises only a single metal layer.

6. The semiconductor package of claim 1, wherein the shield includes a first thickness in an area located over the micro-structure element, and a second thickness in areas not located over the micro-structure element, and the first thickness is less than the second thickness.

7. The semiconductor package of claim 6, wherein the micro-structure element includes a first element and a second element, and the shield comprises the first thickness in areas located over the first and second micro-structure elements, and the second thickness in areas not located over the first and second micro-structure elements.

8. The semiconductor package of claim 1, wherein the semiconductor die is devoid of active circuitry.

9. A semiconductor package, comprising:
    a semiconductor die;
    a micro-structure element disposed on an upper surface of the semiconductor die;

a conductive element disposed on the upper surface of the semiconductor die and circumscribing the micro-structure element; and a shield disposed over the micro-structure element to provide electromagnetic interference (EMI) shielding for the micro-structure element;

wherein the shield comprises a first thickness in an area located over the micro-structure element, and a second thickness in areas not located over the micro-structure element, and the first thickness is less than the second thickness; and wherein the semiconductor die includes at least one through hole, and the shield is electrically connected to the conductive element and the at least one through hole.

10. The semiconductor package of claim 9, wherein the shield includes an opening that exposes a space beneath the shield surrounding the micro-structure element to the ambient.

11. The semiconductor package of claim 9, wherein the conductive element extends to a periphery of the semiconductor die.

12. The semiconductor package of claim 9, wherein the conductive element is set back from a periphery of the semiconductor die.

13. The semiconductor package of claim 9, wherein the shield includes a base layer and a metal layer covering the base layer.

14. The semiconductor package of claim 9, wherein the shield comprises only a single metal layer.

15. The semiconductor package of claim 9, wherein the micro-structure element includes a first element and a second element, and the shield comprises a first thickness in areas located over the first and second micro-structure elements, and a second thickness in areas not located over the first and second micro-structure elements, and the first thickness is less than the second thickness.

16. The semiconductor package of claim 9, wherein the semiconductor die is devoid of active circuitry.

* * * * *